(12) United States Patent
Chang

(10) Patent No.: US 6,448,605 B1
(45) Date of Patent: Sep. 10, 2002

(54) METHOD OF FABRICATING GATE

(75) Inventor: Ching-Yu Chang, Yilan Hsien (TW)

(73) Assignee: Macronix International Co. Ltd., Hsinchu (TW)

( * ) Notice: Subject to any disclaimer, the term of this patent is extended or adjusted under 35 U.S.C. 154(b) by 0 days.

(21) Appl. No.: 09/924,904

(22) Filed: Aug. 8, 2001

Related U.S. Application Data

(63) Continuation of application No. 09/734,406, filed on Dec. 11, 2000, now Pat. No. 6,300,196.

(30) Foreign Application Priority Data

Sep. 26, 2000 (TW) .......................................... 89119796 A

(51) Int. Cl.⁷ .............................................. H01L 29/76
(52) U.S. Cl. ...................... 257/314; 257/315; 257/318; 257/320; 438/257; 438/259; 438/266
(58) Field of Search ................................. 438/257–266, 438/593, 594; 257/261, 314, 315, 316, 317, 318, 319, 320, 321, 326, 385

(56) References Cited

U.S. PATENT DOCUMENTS 6,248,631 B1 * 6/2001 Huang et al. ............... 438/260
6,323,085 B1 * 11/2001 Sandhu et al. ............. 438/257

* cited by examiner

*Primary Examiner*—Chandra Chaudhari
*Assistant Examiner*—Jack Chen
(74) *Attorney, Agent, or Firm*—J.C. Patents

(57) ABSTRACT

A method of fabricating a gate is described. A first dielectric layer having a first opening is formed on a substrate. A gate dielectric layer is formed in the opening. A lower portion of a floating gate is formed on the gate dielectric layer. A source/drain region is formed in the substrate beside the lower portion of the floating gate. A conductive layer is formed on the first dielectric layer to completely fill the first opening. The conductive layer is patterned to form a second opening in the conductive layer. The second opening is above the first opening and does not expose the first dielectric layer. The second opening has a tapered sidewall and a predetermined depth. A mask layer is formed to cover the conductive layer and fill the second opening. The mask layer outside the second opening is removed to expose the conductive layer. A portion of the mask layer is removed to leave a first etching mask layer in the second opening. An anisotropic etching process using the first etching mask layer as a mask is performed to etch the conductive layer. An upper portion of the floating gate is formed. The first dielectric layer is exposed. The first etching mask is removed. Thereafter, a dielectric layer between gates and a control gate is formed over the floating gate.

8 Claims, 11 Drawing Sheets

METHOD OF FABRICATING GATE

This application is a continuation of application Ser. No. 09/734,406, filed Dec. 11, 2000, now U.S. Pat. No. 6,300,196.

CROSS-REFERENCE TO RELATED APPLICATION

This application claims the priority benefit of Taiwan application Ser. No. 89119796, filed Sep. 26, 2000

BACKGROUND OF THE INVENTION

1. Field of the Invention

The invention relates to a fabrication method of forming a gate and a structure of a gate. More particularly, this invention relates to a method for increasing the effective surface area of the dielectric layer between the gates (a dielectric layer between a floating gate and a control gate).

2. Description of the Related Art

Stacked-gate non-volatile memory devices such as erasable programmable read only memory (EPROM), electrically erasable programmable read only memory (EEPROM) and flash memory, have attracted great attention and research due to excellent data storage properties without applying additional electric field.

The current-voltage (I–V) characteristics of the stacked-gate non-volatile memory devices can be derived from the I–V characteristics and the coupling effect of the conventional metal-oxide semiconductor (MOS) device. Usually, the higher the capacitive coupling effect a device has, the lower operation voltage is required.

FIG. 1 shows a structure of a conventional stacked-gate non-volatile flash memory after forming and patterning conductive layers 26 and 50. The conductive layers 26 and 50 construct a floating gate. A dielectric layer 24 is formed as the gate dielectric layer between the substrate and the floating gate. In FIG. 1B, a dielectric layer 52 is formed on the floating gate, and a control gate is formed on the dielectric layer 52. The control gate includes a conductive layer 54. Both FIGS. 1A and 1B have a gate 58 and a non-gate region 60. The conductive layers 26 and 50 in the non-gate region 60 are removed while patterning the dielectric layer 52 and the conductive layer 54.

FIG. 2 shows a cross-sectional view of FIG. 1 taken along the line II—II. In FIG. 2, a gate is formed on a substrate comprising a semiconductor substrate 20, a source region 22 and a drain region 23 The gate comprises the gate dielectric layer 24, the conductive layers 26 and 50, the dielectric layer 52 and the conductive layer 54. The conductive layer at least includes one layer. The gate dielectric layer 24 is a dielectric layer between the gate and the substrate. Conductive layers 26 and 50 together form a floating gate. The dielectric layer 52 is a dielectric layer between gates. The conductive layer 54 is a control gate.

The conventional stacked-gate non-volatile flash memory comprises four junction capacitors. They are $C_{FG}$ between the floating gate (the conductive layers 26 and 50) and the control gate (the conductive layer 54), $C_B$ between the floating gate and substrate 20, $C_S$ between the floating gate and the source region 22, and $C_D$ between the floating gate and the drain region 23.

The capacitive coupling ratio can be represented by:

Capacitive coupling ratio $$\text{Capacitive coupling ratio} = \frac{C_{FG}}{C_{FG} + C_B + C_S + C_D}$$

According to the above equation, when the junction capacitor $C_{FG}$ increases, the capacitive coupling ratio increases.

The method for increasing the junction capacitance $C_{FG}$ includes increasing the effective surface of the dielectric layer between gates (the floating gate and the control gate), reducing the thickness of the dielectric layer between gates, and increasing the dielectric constant (k) of the dielectric layer between gates.

The dielectric layer between the floating gate and the control gate requires a sufficient thickness to prevent the electrons within the floating gate from flowing into the control gate during operation, resulting in device failure.

The increase of the dielectric constant of the dielectric layer between the floating gate and the control gate involves the replacement of fabrication equipment and the maturity of fabrication technique. Thus, it is not easy to increase the dielectric constant.

Therefore, increasing the effective surface area of the dielectric layer between the floating gate and the control gate becomes a trend for increasing the capacitive coupling ratio.

Referring to FIGS. 1A, 1B and 2, when the dielectric layer 52 and the conductive layer 54 are patterned, the conductive layer 54, the dielectric layer 52, the conductive layers 50 and 26 in the non-gate region are removed. Since the conductive layer 50 has a thickness, the vertical etching thickness of the dielectric layer 52 is greater than the lateral etching thickness of the dielectric layer 52. Thus, it causes difficulty in etching. The dielectric layer residue of the dielectric layer 52 is even left.

The signal storage of the dynamic random access memory (DRAM) is performed by selectively charging or discharging the capacitors on the surface of a semiconductor substrate. The reading or writing operation is executed by injecting or ejecting charges from the storage capacitor connected to a transfer field effective transistor and bit lines.

The capacitor is thus the heart of a dynamic random access memory. When the surface of the memory cell is reduced, the capacitance is reduced. As a consequence, the read-out performance is degraded, the occurrence of soft errors is increased, and the power consumption during low voltage operation is increased. Increasing the surface area of the dielectric layer between the bottom and top electrode becomes one effective method to resolve the above problems.

FIG. 3 is a schematic, cross-sectional view of a conventional stacked gate. A device structure 82 is formed on the semiconductor substrate 80. A dielectric layer 84 is formed over the semiconductor substrate 80. An opening 86 is formed in the dielectric layer 84 to expose the device structure 82. A bottom electrode connected to a conventional stacked transistor is formed to fill the opening 86 and cover a portion of the dielectric layer 84. Since the bottom electrode 88 is a stacked type, the surface of the bottom electrode 88 is limited by its shape The bottom electrode 88 for the conventional stacked-type transistor is not great.

Cylinder capacitors have increased surface areas. However, many photomasks are required in the fabrication process. The fabrication is complex and time-consuming.

SUMMARY OF THE INVENTION

The invention provides a fabrication method and structure of a gate. The present invention increases the effective surface of the dielectric layer between gates (the floating gate and the control gate). In addition, the vertical etching thickness of the dielectric layer between gates is reduced.

In the present invention, a first dielectric layer having a first opening is formed on a substrate. A gate dielectric layer is formed in the opening. A lower portion of a floating gate is formed on the gate dielectric layer A source/drain region is formed in the substrate beside the lower portion of the floating gate. A conductive layer is formed on the first dielectric layer to completely fill the first opening. The conductive layer is patterned to form a second opening in the conductive layer. The second opening is above the first opening and does not expose the first dielectric layer. The second opening has a tapered sidewall and a predetermined depth. A mask layer is formed to cover the conductive layer and fill the second opening. The mask layer outside the second opening is removed to expose the conductive layer. A portion of the mask layer is removed to leave a first etching mask layer in the second opening. An anisotropic etching process using the first etching mask layer as a mask is performed to etch the conductive layer. An upper portion of the floating gate is formed. The first dielectric layer is exposed. The first etching mask is removed. Thereafter, a dielectric layer between gates and a control gate is formed over the floating gate.

In the above-described method, the conductive layer has the second opening. The second opening has a tapered sidewall. The second opening is filled with the first etching mask layer. In addition, the first etching mask does not cover the conductive layer outside the second opening. Thus, the first etching mask is used as a mask while performing anisotropic etching to form the upper portion of the floating gate. Thus, no additional photomask is required. Thus, the invention reduces the use of one photomask.

The upper portion of the floating gate has the second opening. In comparison with the conventional stacked floating gate, the upper portion of the floating gate has an increased surface area. Moreover, the upper portion of the floating gate is formed by anisotropic etching the conductive layer using the first etching mask as a mask. In addition, the second opening in the floating gate has the tapered sidewall. Thus, the upper portion of the floating gate has tapered outer and inner sidewalls.

The above-described method further includes the following steps. A second dielectric layer is formed over the substrate. The second dielectric layer is conformal to the upper portion of the floating gate. At least one second conductive layer is formed to cover the second dielectric layer. A second etching mask layer having a pattern is formed over the second conductive layer. The pattern exposes a portion of the upper portion of the floating gate. A second anisotropic etching process is performed using the second etching mask as a mask. The second conductive layer, the second dielectric layer, the upper portion of the floating gate, a lower portion of the floating gate are etched in sequence to expose a portion of the first dielectric layer, and the gate dielectric layer underlying the lower portion of the floating gate. After the second dielectric layer is etched, a dielectric layer between gates is formed on the upper portion of the floating gate. After the second conductive layer is etched, a control gate is formed on the dielectric layer between the gates. The second etching mask is removed.

In the above-described method, the dielectric layer between gates is conformal to the upper portion of the floating gate Therefore, the dielectric layer between gates has an increased surface area. The performance of the gate is enhanced. The capacitance between the floating ate and the control gate is increased.

In addition, the dielectric layer between gate also has a tapered surface on the tapered inner and outer sidewalls of the upper portion of the floating gate. When the anisotropic etching is performed to etch the dielectric layer between gates, the vertical etching thickness of the dielectric layer between gates is reduced. Thus, the dielectric layer between gates in the non-gate region is easily removed.

In the present invention, the angle between the sidewall of the second opening in the floating gate and the horizontal is about 60 degrees to about 90 degrees. The material of the mask layer is one selected from the group consisting of photoresist material, spin-on glass, oxide, silicon nitride, doped oxide, doped silicon nitride, borosilicate glass (BSG), borophosphosilicate glass (BPSG), boro-oxide, phospho-oxide, borophospho-oxide, or organic silicide containing silicon and oxide. The mask layer outside the second opening can be removed by etching or chemical mechanical polishing. The predetermined depth of the second opening is about 30% of a thickness of the conductive layer above the first dielectric layer. For example, the upper portion of the floating gate can cover a portion of the first dielectric layer surrounding the first opening.

An invention further provide a gate structure formed on a substrate. The substrate comprises a source/drain region. A dielectric layer is formed over a substrate. A first opening is formed in the gate dielectric layer. A gate dielectric is formed on the substrate exposed by the first opening. A lower portion of a floating gate is formed on the gate dielectric layer. The first opening is filled with an upper portion of the floating gate. The upper portion of the floating gate and the lower portion of the floating gate are electrically connected. The upper portion of the floating gate has a tapered outer sidewall. A second opening having a tapered sidewall is formed in the upper portion of the floating gate. The second opening having a predetermined depth is located above the first opening. A dielectric layer between gates is formed over the floating gate. The dielectric layer between gates is conformal to the upper portion of the floating gate. A control gate is formed over the dielectric layer between gates. In the above-described gate structure, the upper portion of the floating gate has a tapered outer sidewall. The second opening in the upper portion of the floating gate has a tapered sidewall. Thus, the upper portion of the floating gate has an increased surface and has tapered inner and outer sidewalls. In addition, the dielectric layer between gates is conformal to the upper portion of the floating gate. Thus, the dielectric layer between gates has an increased surface. The dielectric layer between gates in the non-gate region can be easily removed. As the surface area of the dielectric layer between gates is increased, the performance of the gate is enhanced. The capacitance between the floating gate and the control gate is increased.

According to the above-described method and structure, the present invention can also be used for forming a DRAM capacitor Base on the same mechanism, in the DRAM capacitor, the gate dielectric layer is a capacitor dielectric layer. The floating gate is the bottom electrode. The control is an upper electrode.

DESCRIPTION OF THE PREFERRED EMBODIMENTS

Figure 1A:
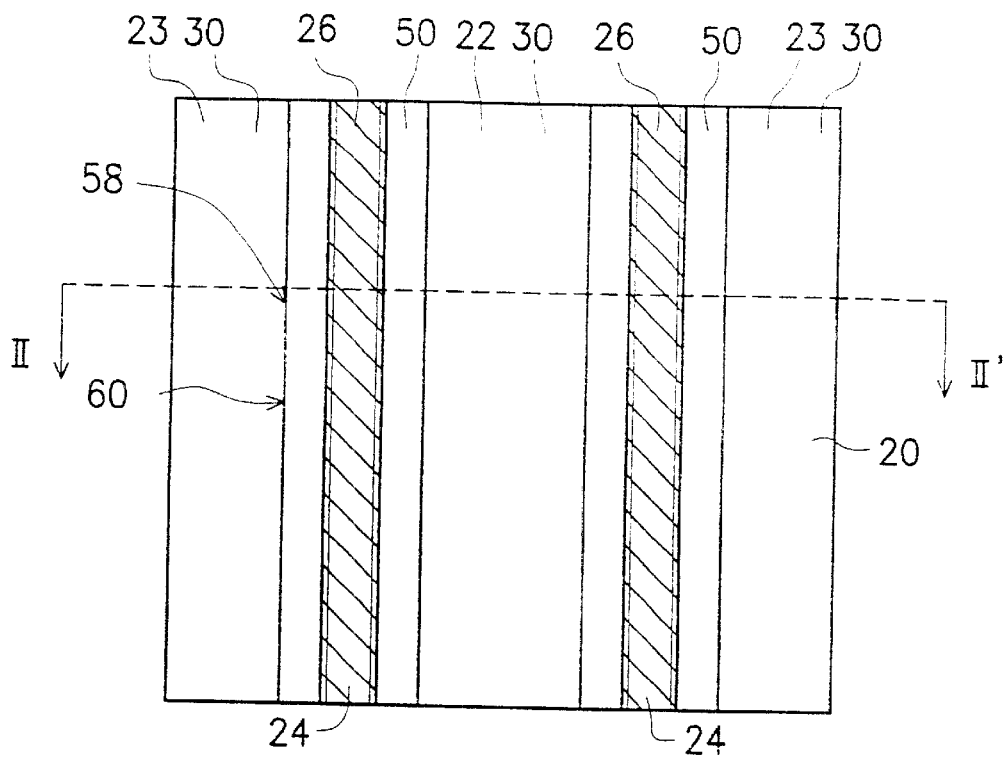
FIG. 1A illustrates a layout of a conventional stacked-gate non-volatile flash memory after forming the floating gate.
Figure 1B:
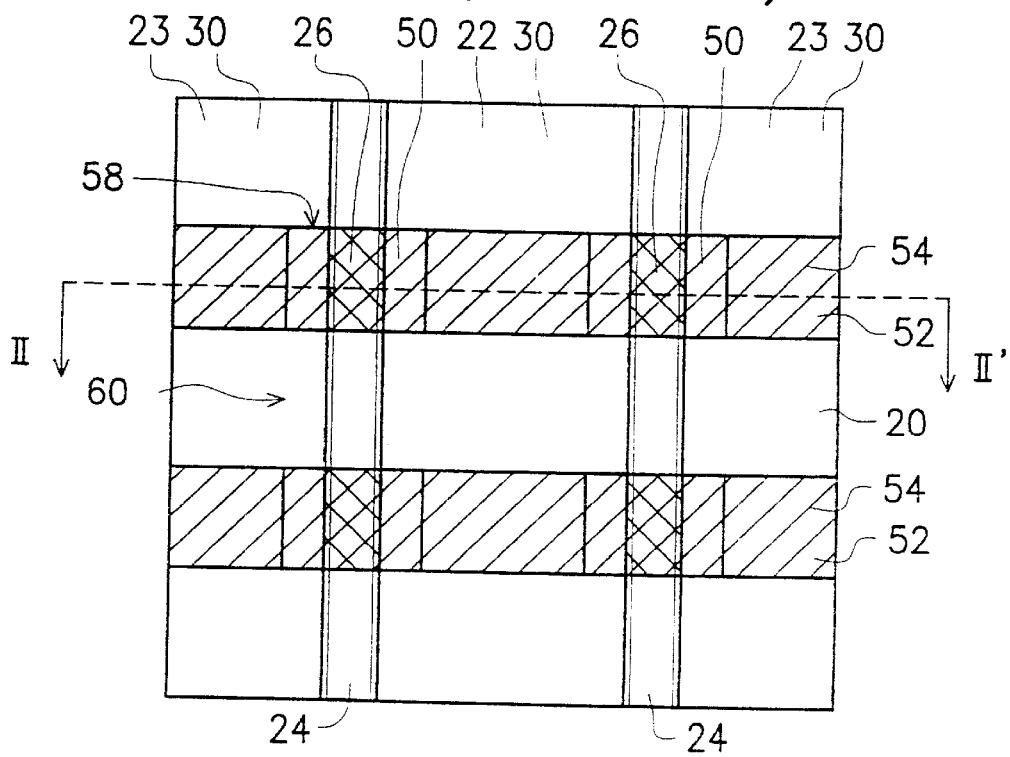
FIG. 1B illustrates the layout of the gate of the stacked-gate non-volatile flash memory as shown in FIG. 1A.
Figure 2:
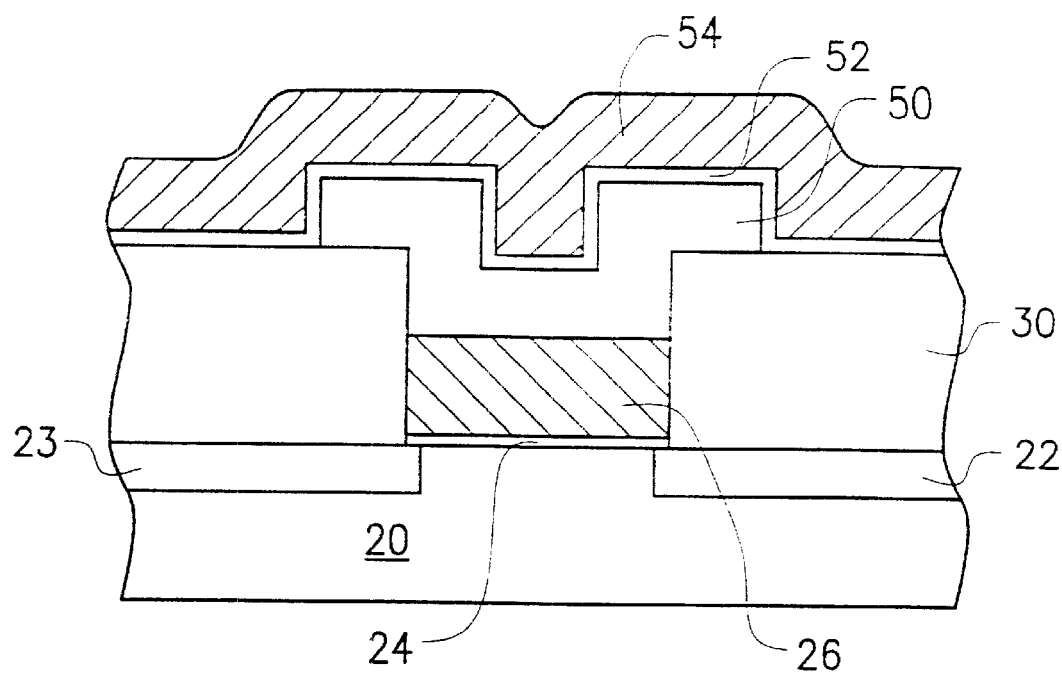
FIG. 2 illustrates a cross-sectional view of FIGS. 1A and 1B taken along the cutting line II–II'.
Figure 3:
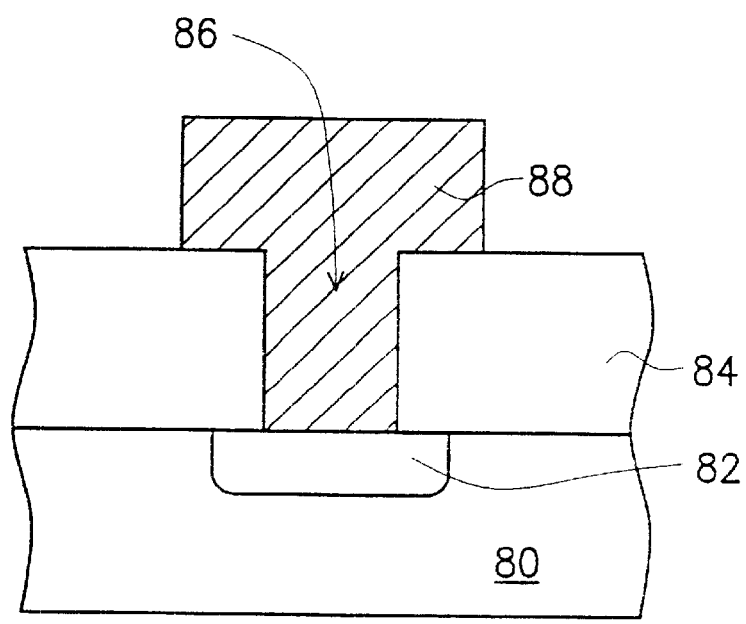
FIG. 3 illustrate a conventional stacked capacitor.

Reference will now be made in detail to the present preferred embodiments of the invention, examples of which are illustrated in the accompanying drawings. Wherever possible, the same reference numbers are used in the drawings and the description to refer to the same or like parts.

Figure 4A:
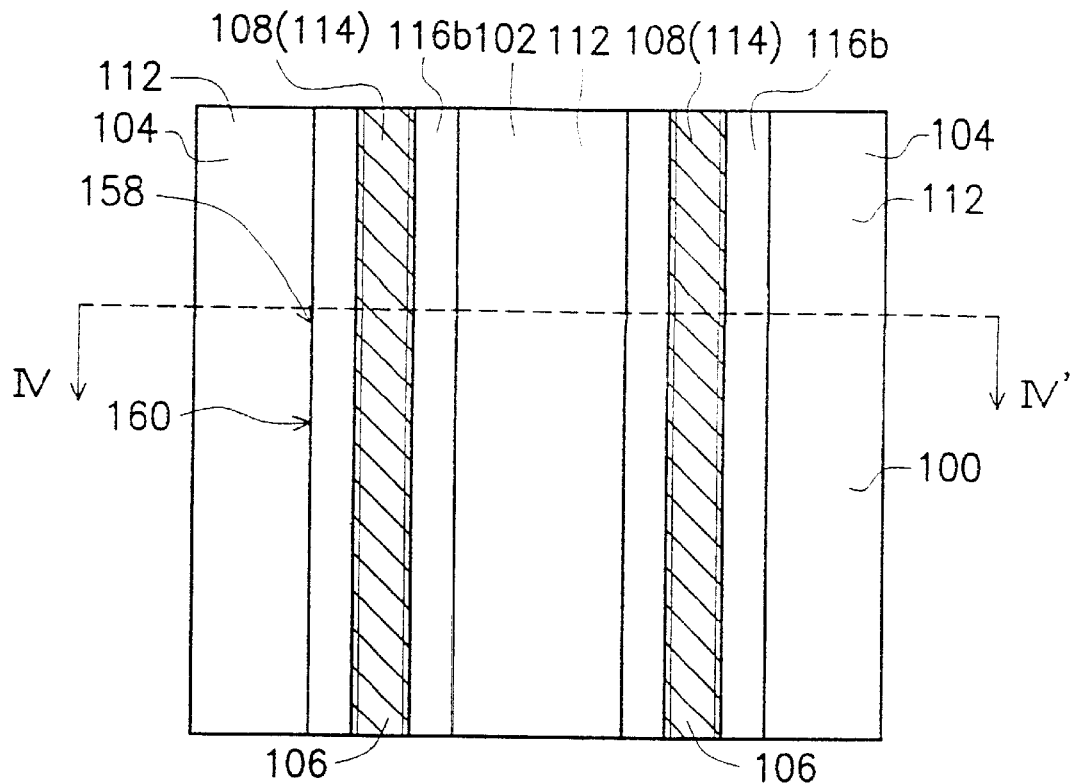
FIG. 4A illustrates a layout of the stacked-gate memory after forming the floating gate according to one preferred embodiment of the present invention.

The present invention provides a gate of the stacked-gate non-volatile flash memory and its fabrication method. The method includes forming an upper portion of the floating gate. The upper portion of the floating gate has a tapered sidewall. The upper portion of the floating gate has an opening with a tapered sidewall. Thus, the upper portion of the floating gate has both tapered inner and outer sidewalls.
First Embodiment FIG. 4A illustrates a layout of the stacked-gate memory after conductive layers 108 and 116 are formed. The conductive layers 108 and 116 together form a floating gate. A gate dielectric layer 106 is formed between the floating gate and a substrate. The gate region 158 and the non-gate region 160 have the same structure thereon.

Figure 4B:
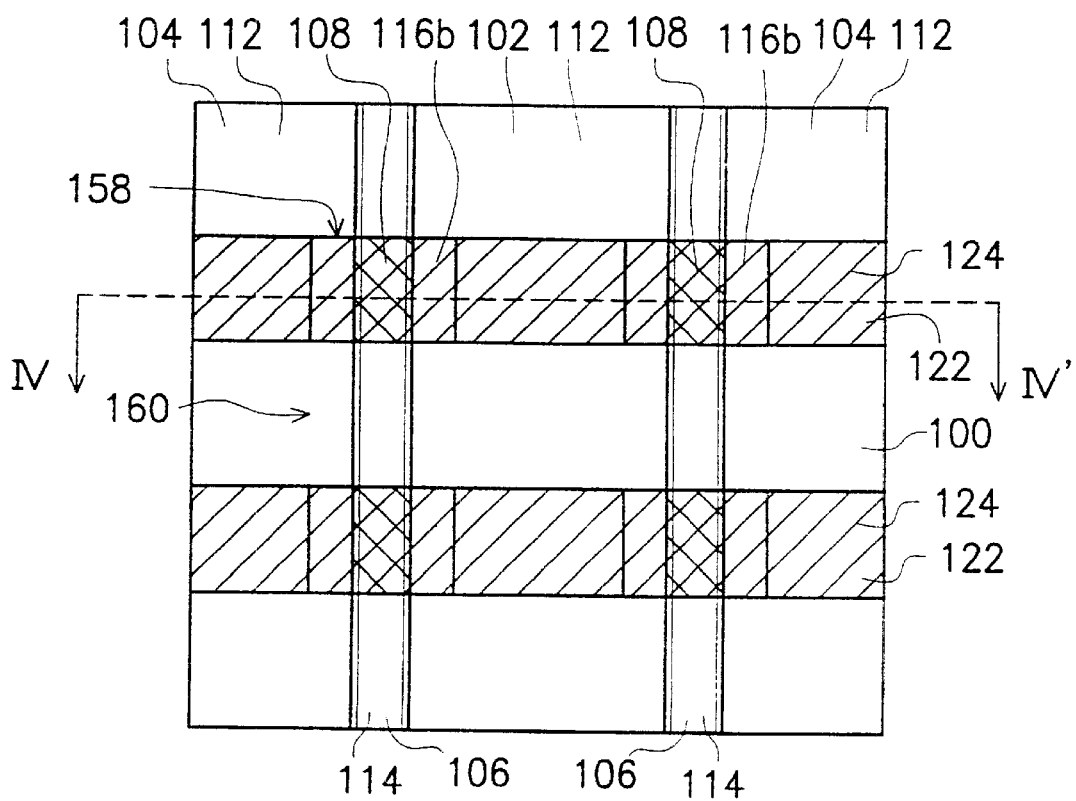
FIG. 4B illustrates the layout of the gate of the stacked-gate non-volatile flash memory as shown in FIG. 4A.

FIG. 4B illustrates the layout of the gate of the stacked-gate non-volatile flash memory as shown in FIG. 4A. A dielectric layer 122 is formed between the floating gate and a control gate. That is the dielectric layer 122 is a dielectric layer between gates. A conductive layer 124 is formed as the control gate. The conductive layer 124 at least has one layer. A gate region 158 includes a gate dielectric layer 106, the conductive layers 108 and 116, a dielectric layer 233, and the conductive layer 124. The conductive layers 108 and 116b in a non-gate region 160 are removed while patterning the dielectric layer 122 and the conductive layer 124. The conductive layer 124 between the gate regions 158 constitutes bit lines (not shown) for connecting gates.

FIG. 5A through FIG. 5H are cross-sectional views of FIGS. 4A ad 4B taken along the cutting line IV–IV'.

Figure 5A:
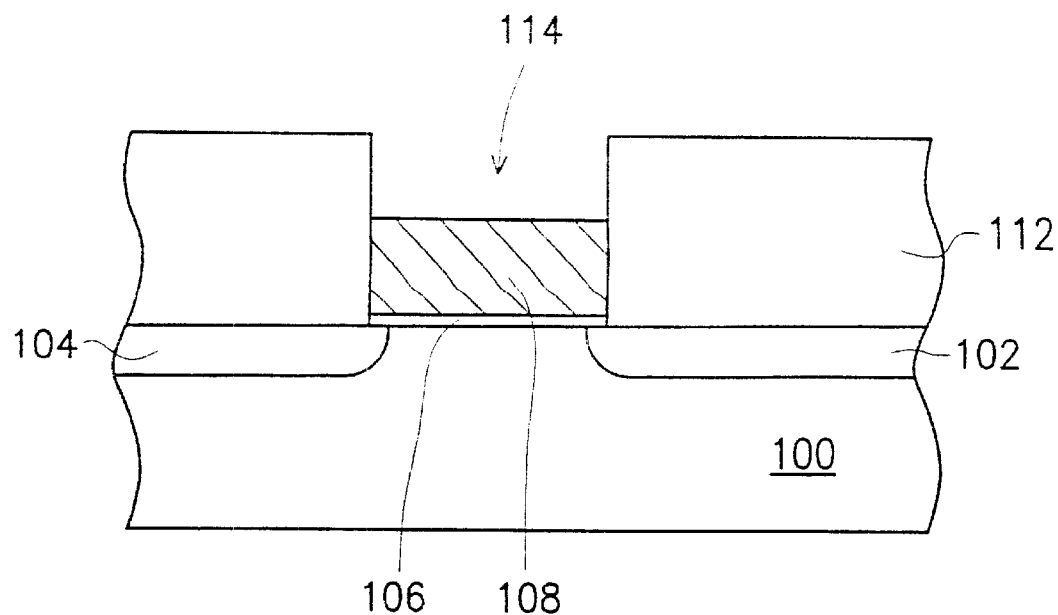
FIG. 5A through FIG. 5H are cross-sectional views of FIGS. 4A ad 4B taken along the cutting line IV—IV; and FIG. 6A through FIG. 6G shows the application of the method provided by the invention to a dynamic random access memory

Referring to FIG. 5A, a semiconductor substrate 100 is provided. A source region 102, a drain region 104, the gate dielectric layer 106, the dielectric layer 112 are formed. The dielectric layer 112 is formed over the semiconductor substrate 100. An opening 114 is formed in the dielectric layer 112. The conducive layer 108 having a top surface lower than that of the dielectric layer 112 is formed in the opening 114.

Figure 5B:
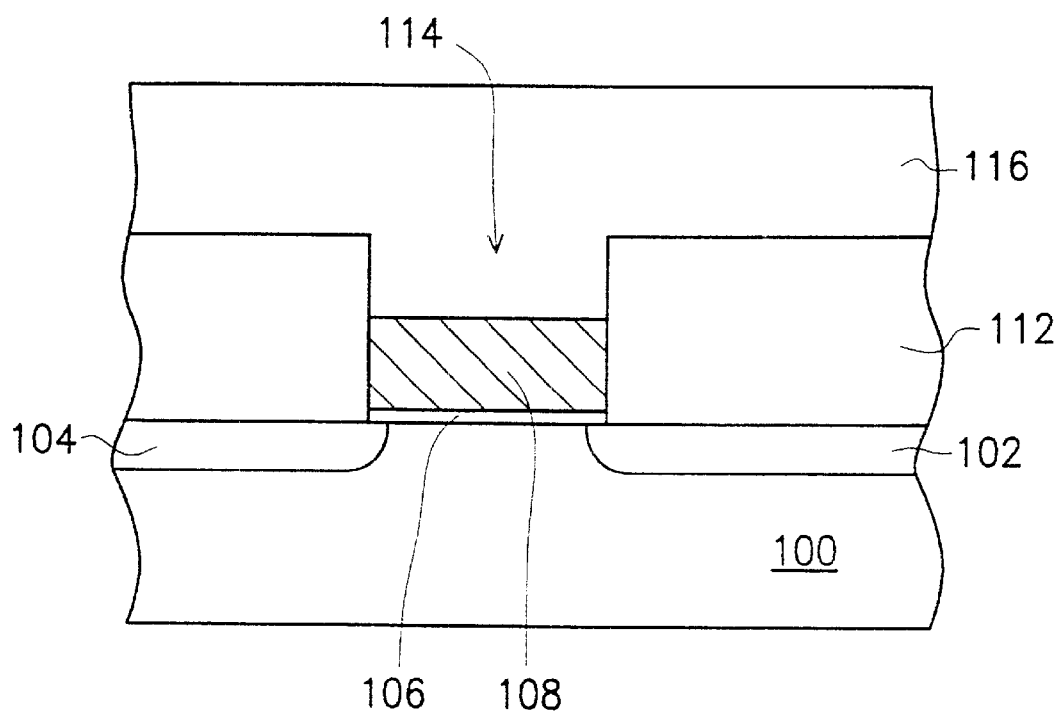

Referring to FIG. 5B, the conductive layer 116 is formed over the dielectric layer 112 to fill the opening 114. The material of the conductive layer 116 includes polysilicon.

Figure 5C:
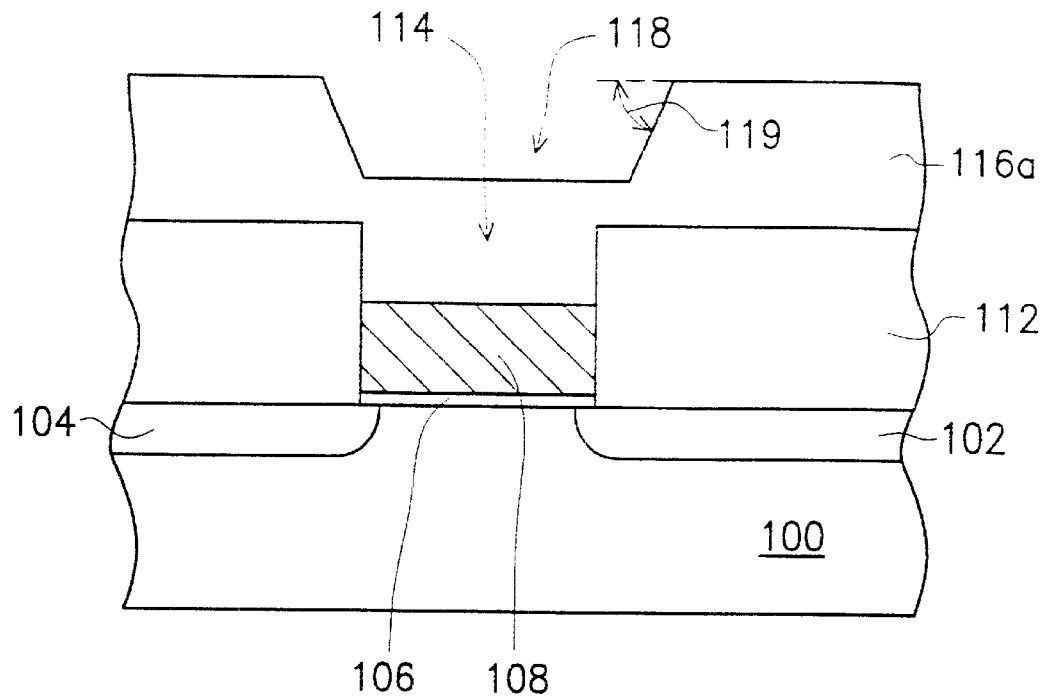

Referring to FIGS. 4A and 5C, an etching mask layer for forming the conductive layer 116b as shown in FIG. 4A is formed over the conductive layer 116. As shown in FIG. 5C, the etching mask layer is used to pattern the conductive layer 116. A conductive layer 116a having an opening 118 is formed. The opening 118 is above the opening 114 and does not expose the dielectric layer 112. The opening 118 has a tapered sidewall. An angle 119 between the tapered sidewall of the opening 118 the horizontal is from about 60 degrees to about 90 degrees. The opening 118 has a predetermined depth. The predetermined depth of the opening 118 is at least about 30% of the thickness of the conductive layer 116a above the dielectric layer 112.

Figure 5D:
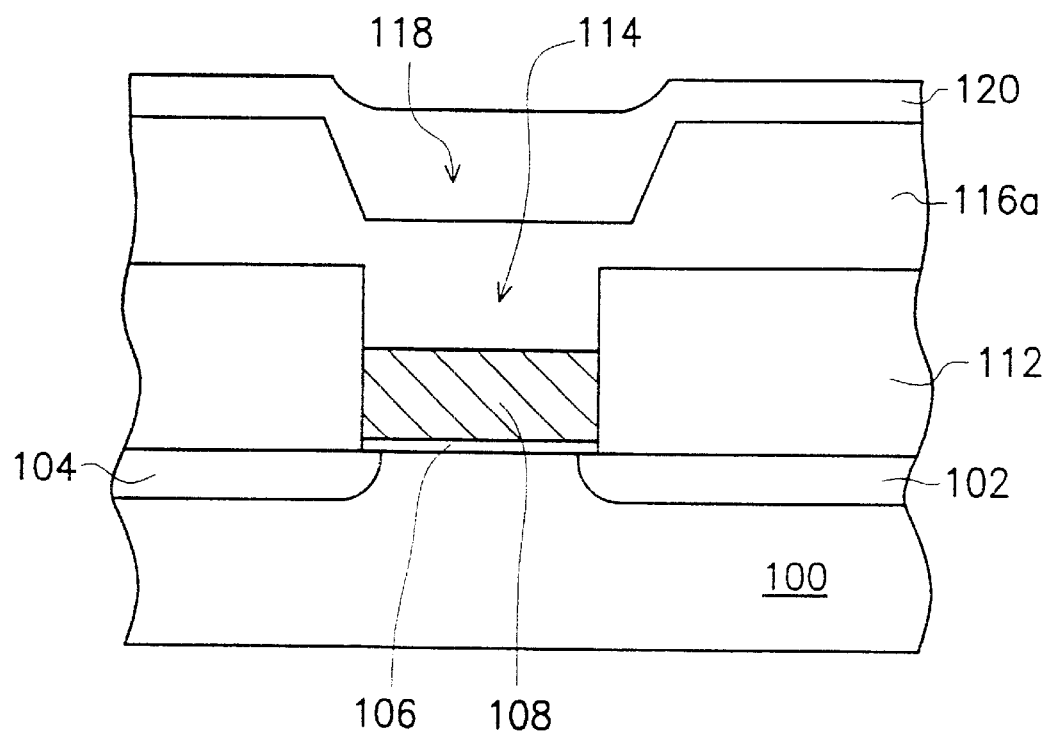

Referring to FIG. 5D, a mask layer 120 is formed to cover the conductive layer 116 to fill the opening 118. The material of the mask layer 120 includes photoresist material, spin-on glass, oxide, silicon nitride, doped oxide, doped silicon nitride, borosilicate glass (BSG), borophosphosilicate glass (BPSG), boro-oxide, phospho-oxide, borophospho-oxide, or organic silicide containing silicon or oxide. If the mask layer 120 is spin-on glass, after the mask layer 120 has been coated, the mask layer 120 needs to be solidified.

Figure 5E:
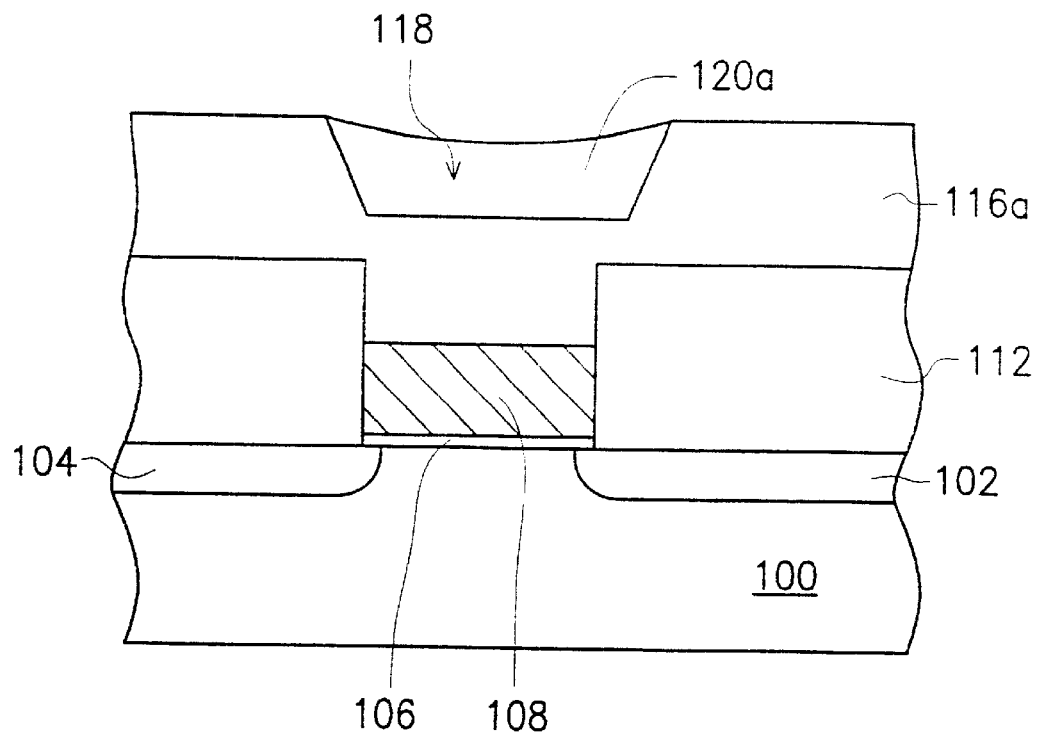

Referring to FIG. 5E, a portion of the mask layer 120 is removed by, for example, etching or chemical-mechanical polishing. In the case that the mask layer 120 is oxide, silicon nitride, doped oxide, doped silicon nitride, borosilicate glass (BSG), borophosphosilicate glass (BPSG), boro-oxide, phospho-oxide, borophospho-oxide, or organic silicide containing silicon and oxide, the mask layer 120 can be removed by etching or chemical-mechanical polishing. In the case that the mask layer 120 is photoresist or spin-on glass, the mask layer 120 can be removed by etching. After a portion of the mask layer 120 is removed, a mask layer 120a filling the opening 118 is left in the conductive layer 116a. The conductive layer 116a outside the opening 118 is exposed.

Figure 5F:
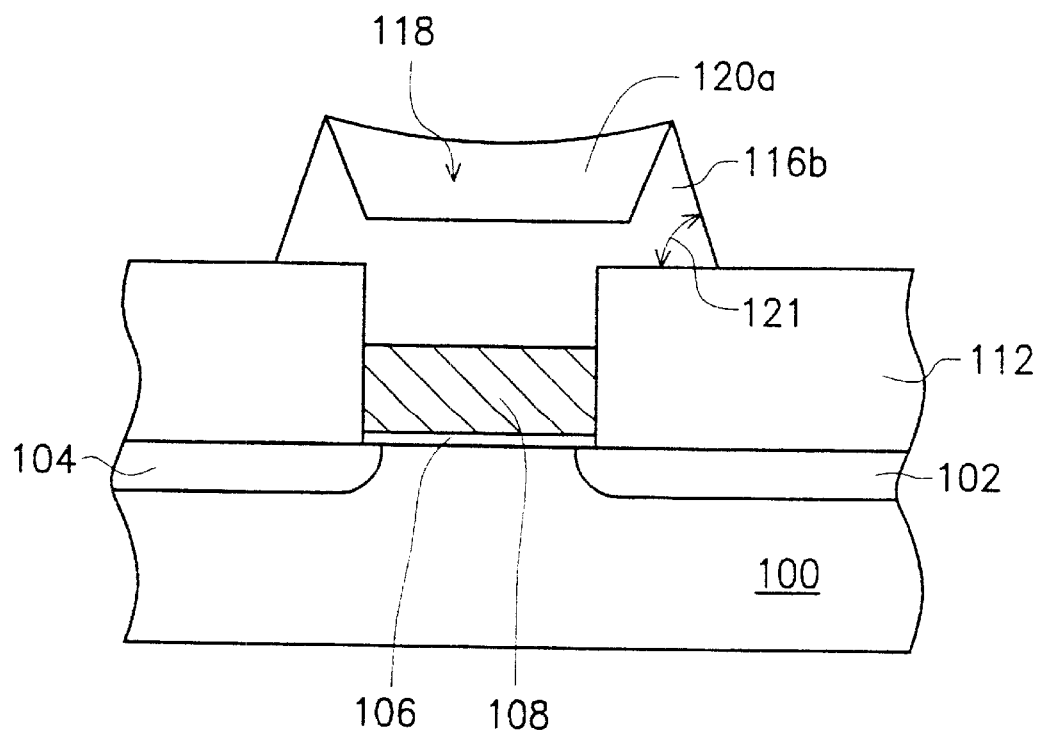

Referring to FIG. 5F, an etching, such as an anisotropic etching, using the mask layer 120a as a mask is performed to etch the conductive layer 116a. A conductive layer 116b is formed to expose a portion of the dielectric layer 112. The conductive layer 116b has an outer tapered sidewall. The angle 121 between the outer tapered sidewall and the horizontal is about 60 degrees to about 90 degrees. The conductive layer 116b covers a portion of the dielectric layer 112 surrounding the opening 114.

Figure 5G:
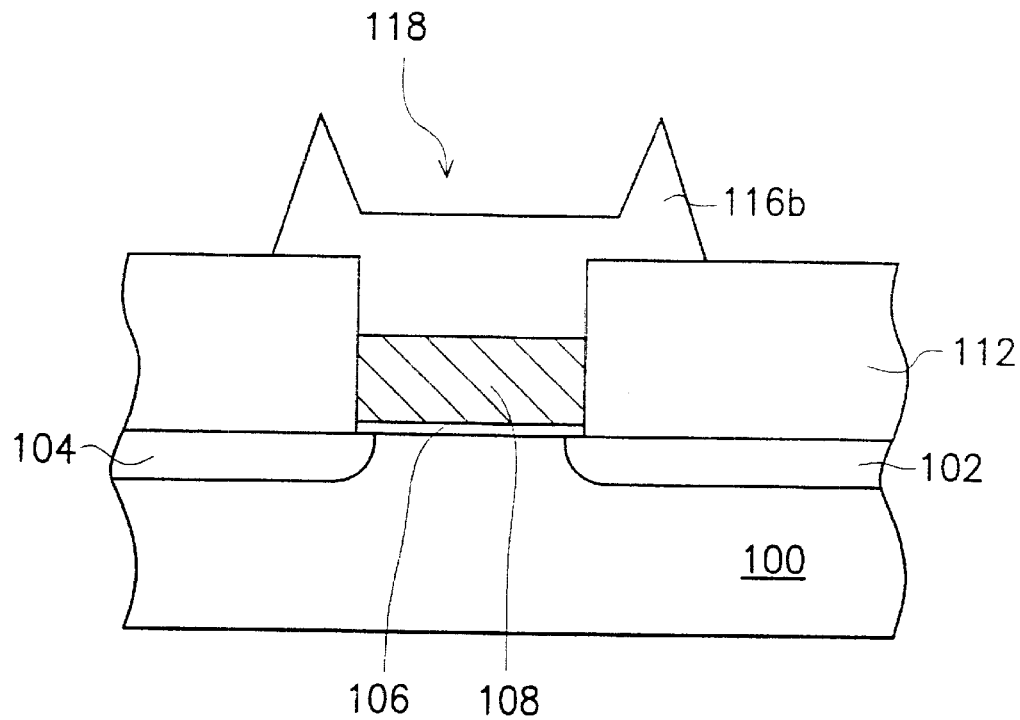

Referring to FIG. 5G, the mask layer 120a is removed to complete the upper portion of the floating gate of the stacked-gate non-volatile flash memory. That is, the conductive layer 116b is formed. The conductive layer 108 and the conductive layer 116b together form a floating gate. The conductive layer 108 and the conductive layer 116b of the FIG. 4A show the layout of the floating gate.

The conductive layer 116a has the opening 118 The opening 118 has a tapered sidewall. The opening 118 is filled with the mask layer 120. Thus, the mask layer 120a can serve as a mask when the conductive layer 116a is etched to form the conductive layer 116b. Thus, no additional photomask is needed to pattern the conductive layer 116a. The number of photomasks required is decreased.

In the conventional stacked-gate non-volatile flash memory, the surface area of conductive layer 50 is limited by its shape and thus the surface area is not great. In the present invention, since the conductive layer 116b has the opening 118, as shown in FIG. 5G, the surface area of the conductive layer 116b is increased.

The opening 118 of the conductive layer 116a has a tapered sidewall. In addition, the conductive layer 116b is formed by anisotropic etching the conductive layer 116a. Thus, the conductive layer 116b has a tapered outer sidewall. Therefore, the conductive layer 116b has tapered outer and inner sidewalls.

Figure 5H:
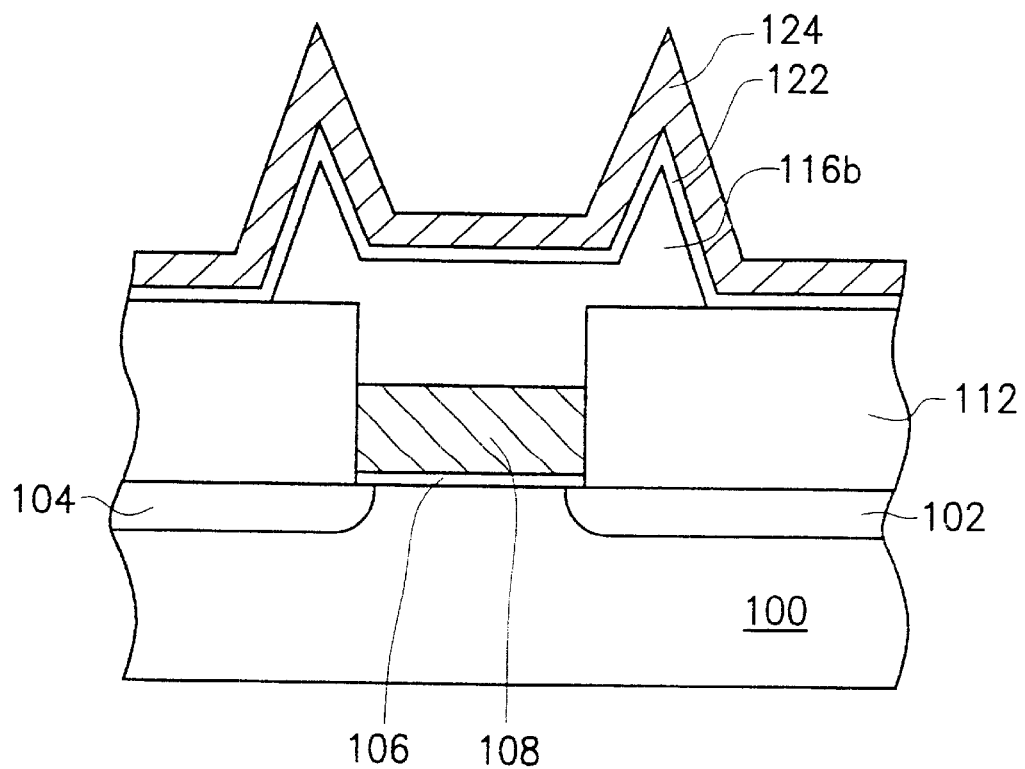

Thereafter, a dielectric layer between gates conformal to the conductive layer 116b is formed over the conductive layer 116b and the dielectric layer 112. A control gate layer is formed over the dielectric layer between the gates. As shown in FIGS. 4A and 4B and 5H, an etching mask for forming the conductive layer 124 of FIG. 4B is formed over the control gate layer. Using the etching mask, in the non-gate region 160, the control gate layer, the dielectric layer between gates, the conductive layer 116b, and the conductive layer 118 are etched in sequence to expose the gate dielectric layer 106. At the same time, the control gate layer and the dielectric layer between gates in the non-gate region and exposed by the mask layer are removed to expose the dielectric layer 112. The etching mask is removed to form the conductive layer 124, the dielectric layer 122. A gate in the gate region 158 and word lines, which connect the gate regions, are formed.

The dielectric layer 122 in the gate region 158 and the conductive layer 116b have the same shape. Thus, the surface area is increased. The dielectric layer 122 is the dielectric layer between gates. The conductive layer 124 is a control gate. Thus, the capacitance between the floating gate and the control gate is increased.

Since the dielectric layer between gates is conformal to the conductive layer 116b, the shape of the dielectric layer between gates in the non-gate region 160 has the same shape as the conductive layer 116b. The conductive layer 116b has a tapered inner and outer sidewall, the dielectric layer between gates in the non-gate region 160 also has a tapered surface. The vertical etching thickness of the dielectric layer between gates in the non-gate region 160 thus is reduced. As a result, the dielectric layer between the gates in the non-gate region 160 is effectively removed.

The material of the dielectric layer 122 includes silicon nitride, silicon oxide, oxide/nitride/oxide (ONO), lead zirconium titanate, bismuth strontium titanate or tantalum oxide. The conductive layer 124 includes at least a layer of conductive material. The material of the conductive layer 124 includes polysilicon or tungsten silicide.

Second Embodiment

Figure 6A:
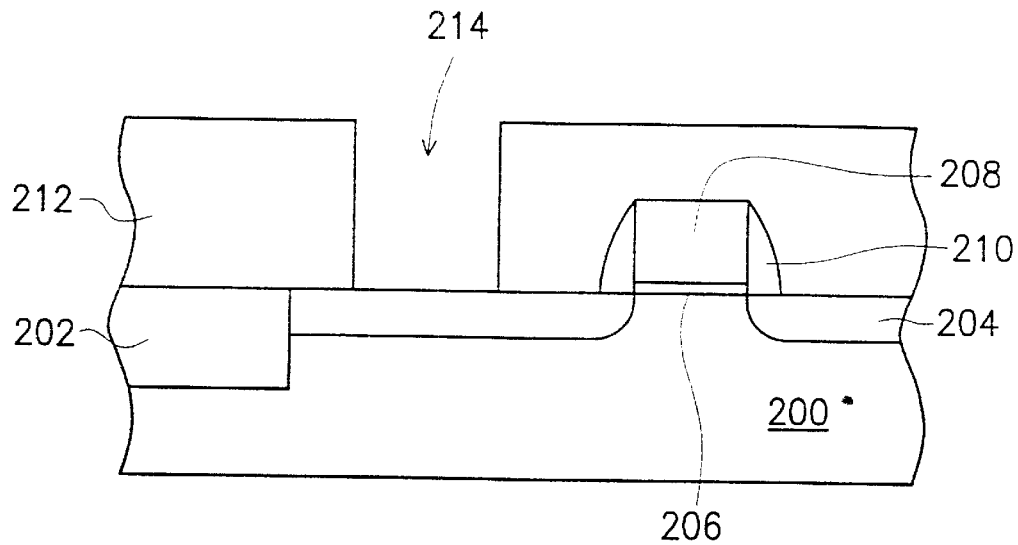

FIGS. 6A through 6G illustrate the fabrication process of forming a electrode according to the present invention. Referring to FIG. 6A, a semiconductor substrate 200 is provided. An isolated region 202 is formed in the semiconductor substrate 200 to define the active regions of devices. A DRAM transistor is formed on the semiconductor substrate 200. The transistor includes a source/drain region 204, a gate dielectric layer 206, a gate 208, and a spacer 210. A dielectric layer 212 is formed over the semiconductor substrate 200. An opening 214 is formed in the dielectric layer 212 to expose the source/drain region 204 of the transistor.

Figure 6B:
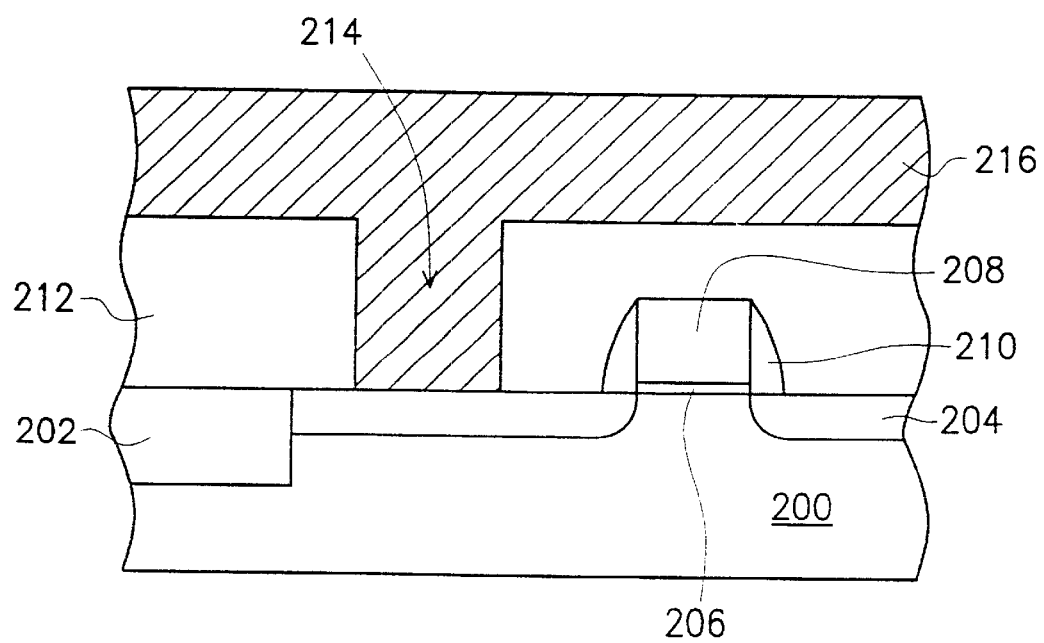

Referring to FIG. 6B, a conductive layer 216 is formed over the dielectric layer 212 to fill the opening 214. The material of the conductive layer 216 includes polysilicon.

Figure 6C:
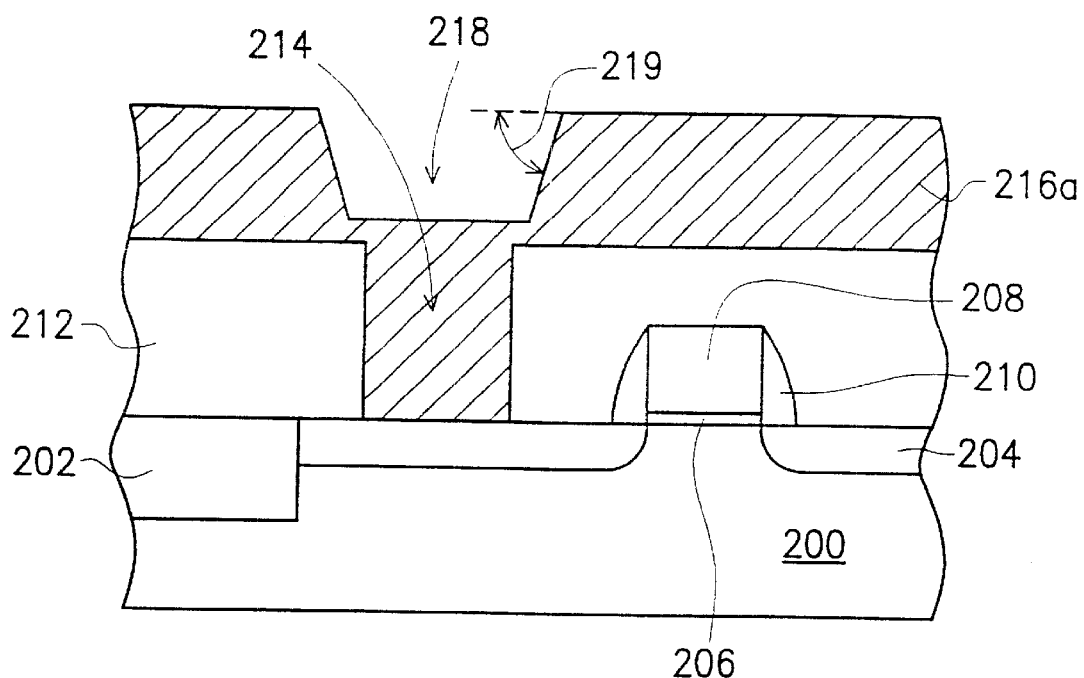

Referring to FIG. 6C, the conductive layer 216 is patterned to form a conductive layer 216a. The conductive layer 216a has an opening 218. The opening 218 is above the opening 214. The opening 218 does not expose the dielectric layer 212 and has a tapered sidewall. An angle 219 between the tapered sidewall and the horizontal is about 60 degrees to about 90 degrees. The opening 218 has a predetermined depth. The predetermined depth of the opening 218 is at least about 30% of the thickness of the conductive layer 216a above the dielectric layer 212.

Figure 6D:
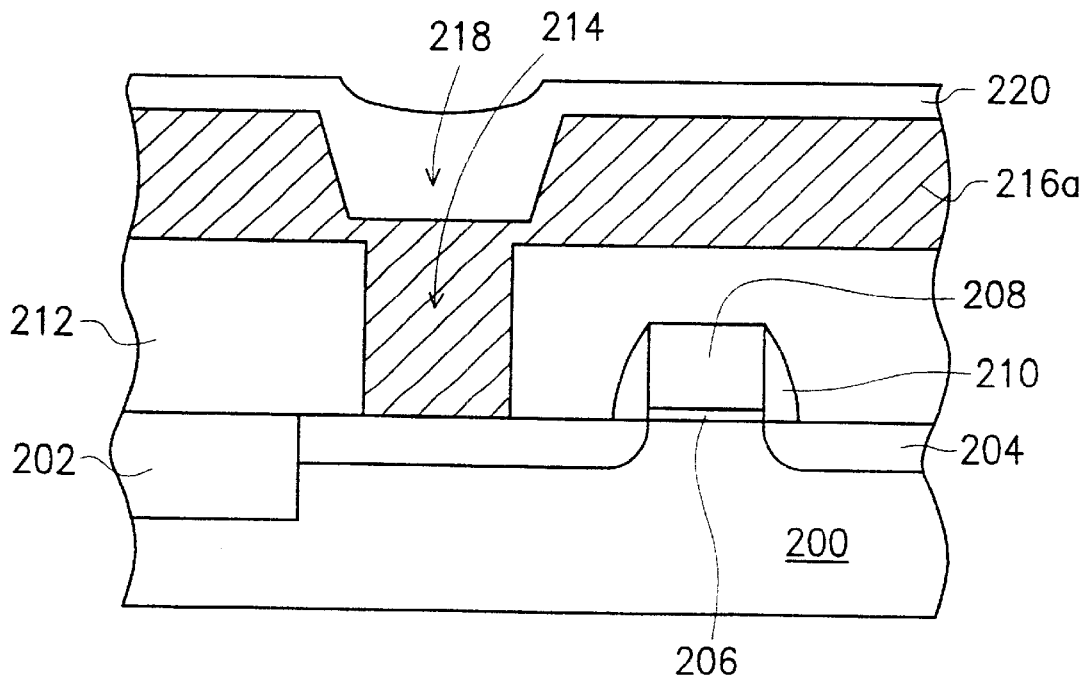

Referring to FIG. 6D, a mask layer 220 is formed to cover the conductive layer 216a and fill the opening 218. The material of the mask layer 230 includes photoresist, spin-on glass, oxide, silicon nitride, doped oxide, doped silicon nitride, borosilicate glass (BSG), borophosphosilicate glass (BPSG), boro-oxide, phospho-oxide, borophospho-oxide, or organic silicide containing silicon and oxide. In the case that the mask layer 220 is a spin-on glass layer, after the mask layer 220 has been coated, the mask layer 220 needs to be solidified.

Figure 6E:
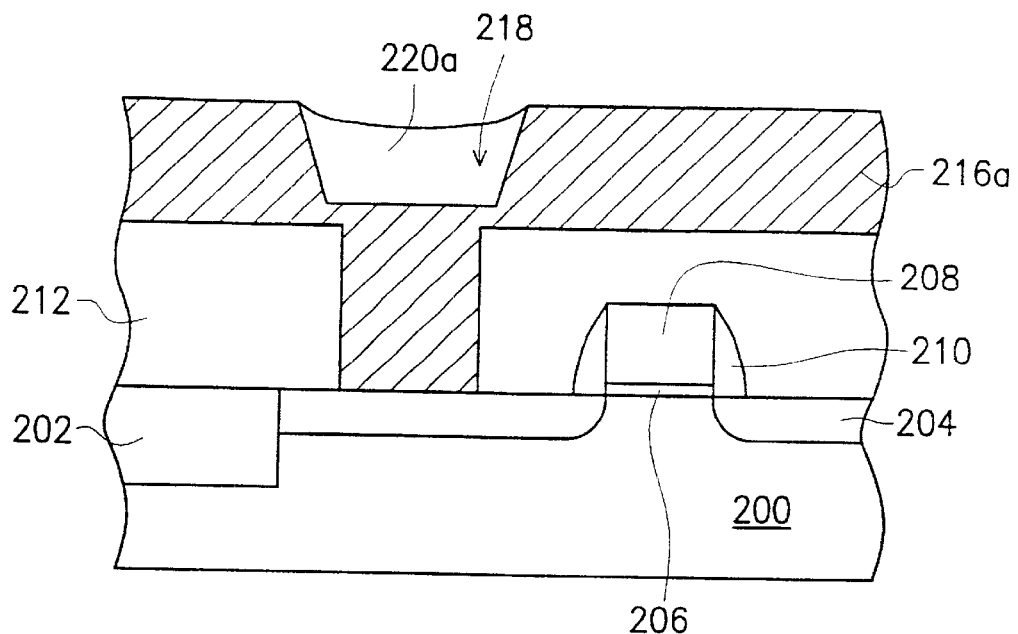

Referring to FIG. 6E, a portion of the mask layer 220 is removed by, for example, etching or chemical-mechanical polishing. In the case that the mask layer 220 is oxide, silicon nitride, doped oxide, doped silicon nitride, borosilicate glass (BSG), borophosphosilicate glass (BPSG), boro-oxide, phospho-oxide, borophospho-oxide, or organic silicide containing silicon and oxide, the mask layer 220 can be removed by etching or chemical-mechanical polishing. In the case that the mask layer 220 that the mask layer 220 is photoresist or spin-on glass, the mask layer 220 can be etching. After a portion of the mask layer 220 is removed, a mask layer 220a is left to fill the opening 218 in the conductive layer 216a. The conductive layer 216a outside the opening 118 is exposed.

Figure 6F:
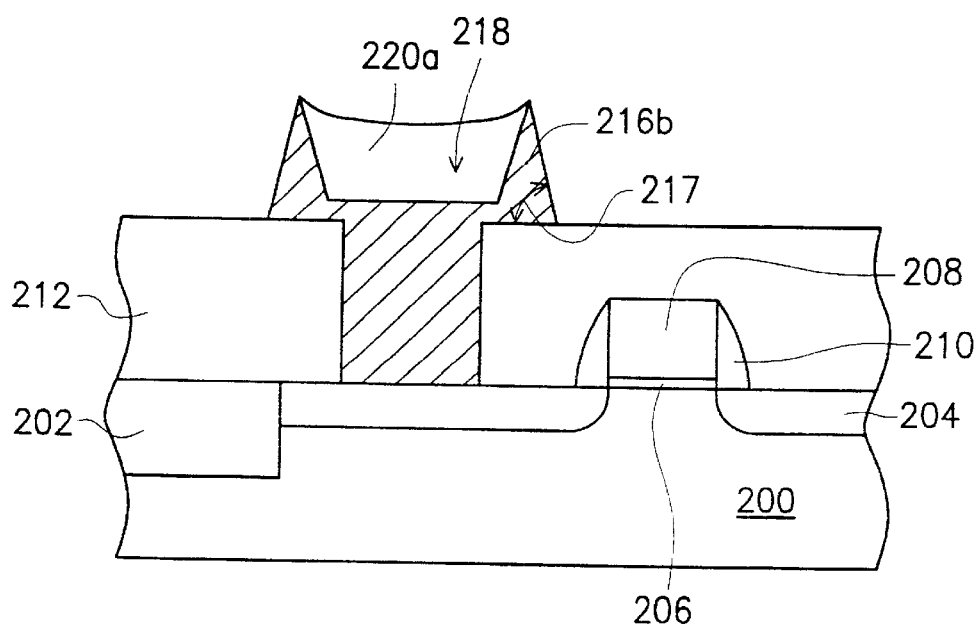

Referring to FIG. 6F, an etching, such as an anisotropic etching, using the mask layer 220a as a mask is performed. A conductive layer 216a is etched to form a conductive layer 216b. The conductive layer 216b exposes a portion of the dielectric layer 212.

Figure 6G:
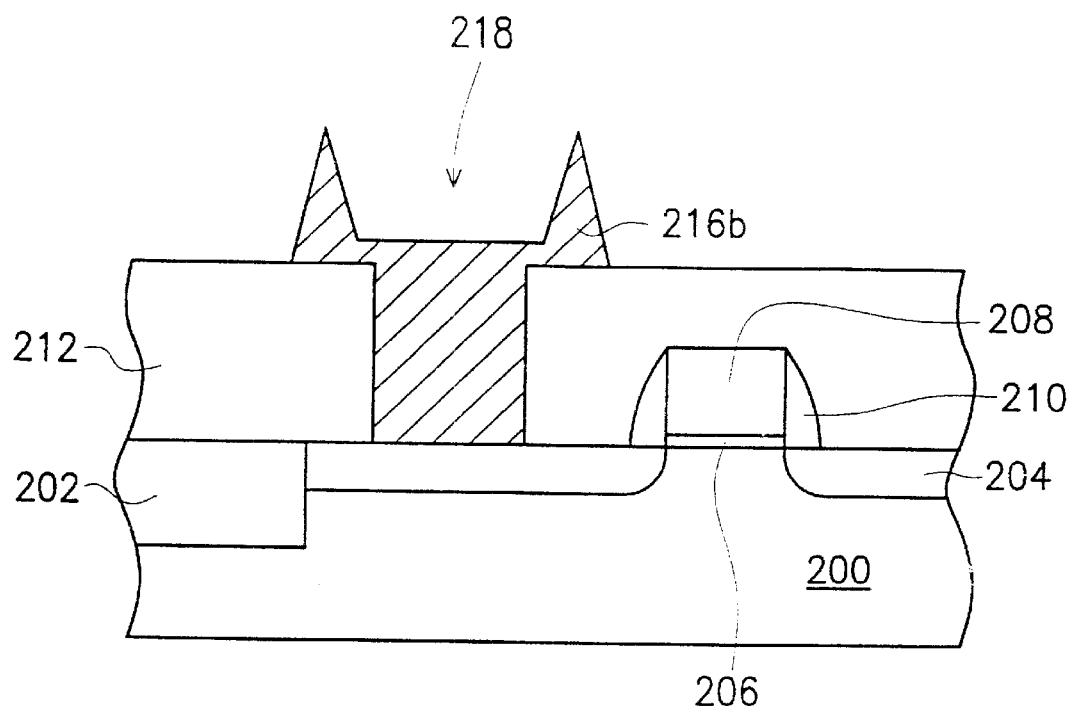

Referring to FIG. 6G, the mask layer 220a is removed to complete the upper portion of the floating gate of the stacked-gate non-volatile flash memory. That is, the conductive layer 216b is formed. The conductive layer 216b has a tapered outer sidewall. An angle 217 between the tapered outer sidewall and the horizontal is about 60 degrees to about 90 degrees. The conductive layer 216b covers a portion of the dielectric layer 212 surrounding the opening 214.

The opening 218 has a tapered sidewall. The mask layer 220 fills the opening 218. Thus, the mask layer 220a can serve as a mask when the conductive layer 216a is etched to form the conductive layer 216b. Thus, no additional photomask is needed when the conductive layer 116a is patterned. The number of required photomasks is decreased.

The shape of the conventional stacked capacitor limits the surface area of storing charges. In the foregoing embodiment, because the conductive layer 216b has the opening 218. The conductive layer 216b has a cylindrical or ring shape. The capacitance of the capacitor is increased.

In summary, the invention provides at least the following advantages:

(1) The opening in the upper portion of the floating gate is filled with the mask layer. The mask layer is used as a mask when an etching step is performed to form the upper portion of the floating gate. No additional photomask is required. Thus, the present invention reduces the use of one photomask.

(2) The upper portion of the floating gate has the opening. Thus, the upper portion of the floating gate formed by the present invention has an increased surface and a tapered inner and outer sidewalls.

(3) After a gate on the upper portion of the floating gate is formed, the surface area of the dielectric layer between the gate is increased. The vertical etching thickness of the dielectric layer between gates in the non-gate region is reduced. Thus, the effective surface area of the dielectric layer between the gates is increased.

(4) The performance of the gates is enhanced. The capacitance between the floating gate and the control gate is increased.

(5) According to the same theory, the above-described opening can also used for forming a DRAM capacitor.

The surface area of the capacitor dielectric layer is increased, and consequently, the capacitance of the capacitor is increased.

It will be apparent to those skilled in the art that various modifications and variations can be made to the structure and the method of the present invention without departing from the scope or spirit of the invention In view of the foregoing, it is intended that the present invention cover modifications and variations of this invention provided they fall within the scope of the following claims and their equivalents.

What is claimed is:

1. A gate structure formed on a substrate, wherein the substrate comprises a source/drain region, comprising:
    a dielectric layer formed over a substrate;
    a first opening formed in the dielectric layer;
    a gate dielectric formed on the substrate exposed by the first opening;
    a lower portion of a floating gate formed on the gate dielectric; and
    an upper portion of the floating gate at least filling in the first opening, wherein the upper portion of the floating gate and the lower portion of the floating gate are electrically connected, the upper portion of the floating gate has a tapered outer sidewall, and a second opening having a tapered sidewall formed in the upper portion of the floating gate, wherein the second opening having a predetermined depth is located above the first opening.

2. The structure of claim 1, wherein an angle of the tapered sidewall of the second opening is about 60 degrees to about 90 degrees.

3. The structure of claim 1 wherein the upper portion of the floating gate covers a portion of the dielectric layer surrounding the second opening.

4. The structure of claim 1, wherein the predetermined depth of the second opening is 30% of a thickness of the upper portion of the floating gate above the dielectric layer.

5. The structure of claim 1, wherein the upper portion of the floating gate is polysilicon or tungsten silicide.

6. The structure of claim 1, further comprising:
    a dielectric film formed on the upper portion of the floating gate; and
    a control gate is formed on the dielectric film.

7. The structure of claim 6, a material of the dielectric film is selected from the group consisting of silicon nitride, silicon oxide, oxide/nitride/oxide (ONO), lead zirconium titanate, bismuth strontium titanate, or tantalum oxide.

8. The structure of claim 6, wherein a material of the control gate is polysilicon or tungsten silicide.

* * * * *